United States Patent [19]

Kohyama et al.

[11] 4,215,357
[45] Jul. 29, 1980

[54] CHARGE TRANSFER DEVICE STORED WITH FIXED INFORMATION

[75] Inventors: Susumu Kohyama, Kawasaki; Nobuhisa Kubota, Yokohama, both of Japan

[73] Assignee: Tokyo Shibaura Electric Co., Ltd., Kawasaki, Japan

[21] Appl. No.: 23,184

[22] Filed: Mar. 23, 1979

Related U.S. Application Data

[63] Continuation of Ser. No. 825,067, Aug. 16, 1977, abandoned.

[30] Foreign Application Priority Data

Aug. 16, 1976 [JP] Japan .................................. 52-97022

[51] Int. Cl.$^2$ ..................... H01L 29/78; G11C 19/28; H03K 5/00; H01L 29/04
[52] U.S. Cl. ................................ 357/24; 307/221 D; 307/238; 357/59; 357/91; 365/183
[58] Field of Search ............. 357/24; 307/221 D, 238; 365/183

[56] References Cited

U.S. PATENT DOCUMENTS

| | | | |
|---|---|---|---|
| 3,654,499 | 4/1972 | Smith | 357/24 |
| 3,789,267 | 1/1974 | Krambeck et al. | 357/24 |
| 3,829,885 | 8/1974 | Nishizawa et al. | 357/24 |
| 3,918,997 | 11/1975 | Mohsen et al. | 357/24 |
| 4,047,215 | 9/1977 | Frye et al. | 357/24 |
| 4,060,738 | 11/1977 | Tasch et al. | 357/24 |

FOREIGN PATENT DOCUMENTS 47044 5/1974 Japan .
140532 12/1976 Japan .

OTHER PUBLICATIONS

Sequin et al. *Charge Transfer Devices* Academic Press, New York (7/75) pp. 18-29.

*Primary Examiner*—Gene M. Munson
*Attorney, Agent, or Firm*—Oblon, Fisher, Spivak, McClelland & Maier

[57] ABSTRACT

A charge transfer device has a means for grouping a charge transfer section of a semiconductor substrate into a plurality of semiconductor regions each provided with a plurality of charge transfer electrodes and storing a fixed information, predetermined correspondingly to a combination of surface potential levels to be formed at semiconductor subregions under the electrodes on each semiconductor region, in such semiconductor region.

5 Claims, 15 Drawing Figures

CHARGE TRANSFER DEVICE STORED WITH FIXED INFORMATION

This is a continuation of application Ser. No. 825,067 filed Aug. 16, 1977, now abandoned.

BACKGROUND OF THE INVENTION

This invention relates to a charge transfer device. CCD (charge coupled device) and BBD (bucket brigade device) are widely known as typical examples of the charge transfer devices. These charge transfer devices include an information input section, an input information transfer section or charge transfer section, and a reading section to read out transferred charges or input information successively. However, there is a demand for charge transfer devices capable of not only transferring and reading input information but also storing predetermined fixed information and reading such information as occasion calls.

Accordingly, an object of this invention is to provide a charge transfer device with a means for storing desired fixed information in a charge transfer section of a semiconductor substrate.

SUMMARY OF THE INVENTION

The device of this invention is a charge transfer device including a plurality of information transfer electrodes arranged on a charge transfer section of a first-conductivity-type semiconductor substrate through an insulation film, electric charges being stored in potential wells formed under such transfer electrodes and then transferred to one direction. Also, it has a means for grouping such charge transfer section into a plurality of semiconductor regions each provided with a plurality of charge transfer electrodes and storing a fixed information, predetermined correspondingly to a combination of surface potential levels to be formed at semiconductor subregions under the electrodes on each semiconductor region, in such semiconductor region.

According to the device of the invention, any fixed information stored in the charge transfer section may be transferred to and read out at the reading section, or any information inputted through the input section may be transferred through the transfer section and read at the reading section whether such information is fixed or not. Thus, the fields of application of charge transfer devices may be extended.

DETAILED DESCRIPTION OF THE PREFERRED EMBODIMENTS

Figure 2A:
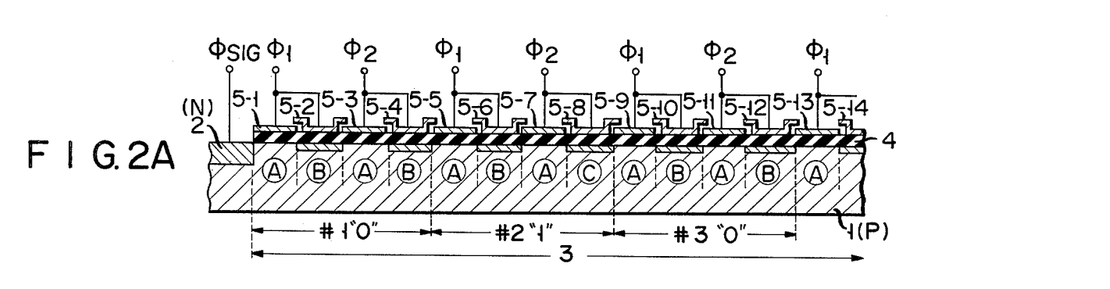
FIG. 2A is a sectional view of the main part of the device showing an embodiment of the invention.

Referring now to FIG. 2A, at the shown left end of a p-type silicon substrate 1 is provided a source region (n-type) 2 to form an input section. On a charge transfer section 3, extending from the shown right end of the source region 2 to the right as shown, is provided a SiO$_2$ (silicon dioxide) layer 4 with a thickness of e.g. 1,000Å, on which charge transfer electrodes 5-1, 5-2, . . . 5-14 are arranged successively. First-phase pulses $\phi_1$ out of two-phase driving pulses are applied to the electrodes 5-1, 5-2, 5-6, 5-6, 5-9, 5-10, 5-13 and 5-14 and second-phase pulses $\phi_2$ are applied to the remaining electrodes, while a voltage $\phi_{SIG}$ is impressed on the source 2. The charge transfer section 3 is grouped into e.g. semiconductor regions #1 to #3. Each region is grouped into four semiconductor subregions, while one electrode is disposed on the SiO$_2$ layer 4 corresponding to each subregion. Each of the regions #1 and #3 includes a series of subregions indicated by (A), (B), (A) and (B), while the region #2 includes a group of subregions (A), (B), (A) and (C). The surface layer of the subregion (A) has the same impurity concentration as that of the semiconductor 1 itself, the surface layer of the subregion (B) has an impurity concentration of the semiconductor substrate 1 ioninjected with $2 \times 10^{13}$ cm$^{-2}$ of phosphorus (n-type) and $1 \times 10^{14}$ cm$^{-2}$ of boron (p-type), and the surface layer of the subregion (C) has an impurity concentration of the semiconductor substrate 1 ion-injected with $5 \times 10^{11}$ cm$^{-2}$ of phosphorus (n-type).

Figure 1:
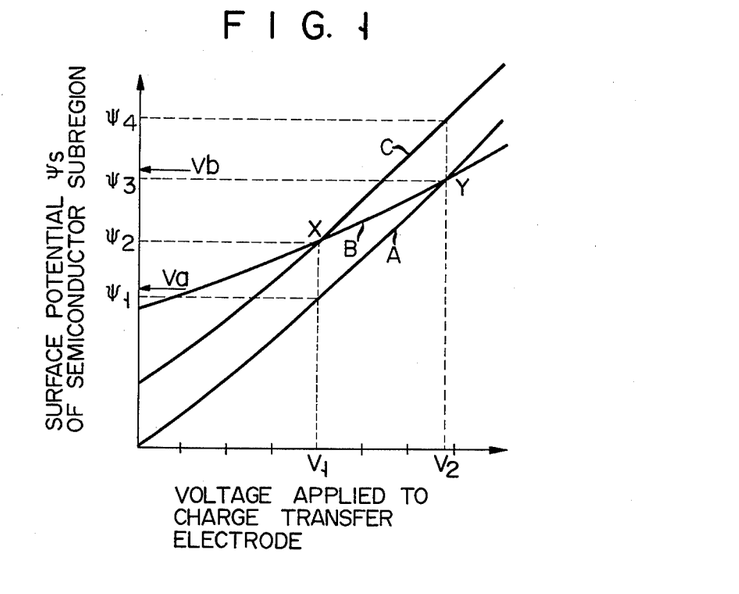
FIG. 1 shows curves for illustrating the relation between the voltage applied to the charge transfer electrodes and the surface potential of the semiconductor layer under these electrodes in an embodiment of the device according to this invention.

Referring now to FIG. 1, there is shown the relation between the voltage applied to the electrodes of thus constructed transfer section and the surface potential at the semiconductor surface layer underlying the electrodes. In FIG. 1, lines A, B and C are given as correspondents to the subregions (A), (B) and (C) as shown in FIG. 2A, respectively. As may be clear from FIG. 1, the lines B and C cross each other at point X, while the lines B and A cut each other at point Y. Therefore, when a potential V$_1$ is applied, the surface potential at the subregion (A) becomes $\Psi_1$, while the surface potentials at the subregions (B) and (C) become $\Psi_2$. If a voltage V$_2$ is applied, then the surface potentials at the subregions (A) and (B) will be given at $\Psi_3$, and the surface potential at the subregion (C) will become $\Psi_4$.

Figure 2B:
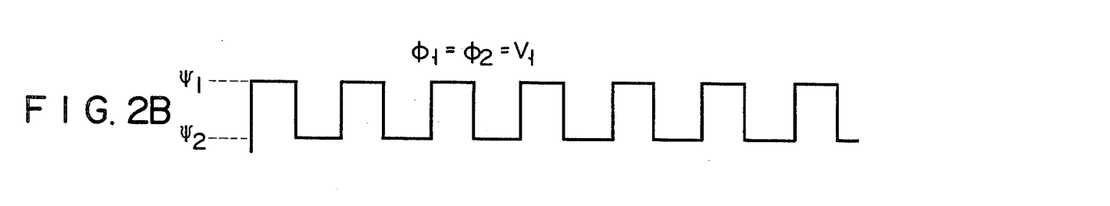
FIGS. 2B and 2C are distribution diagrams for the surface potentials at the charge transfer section of the device as shown in FIG. 2A.
Figure 2C:
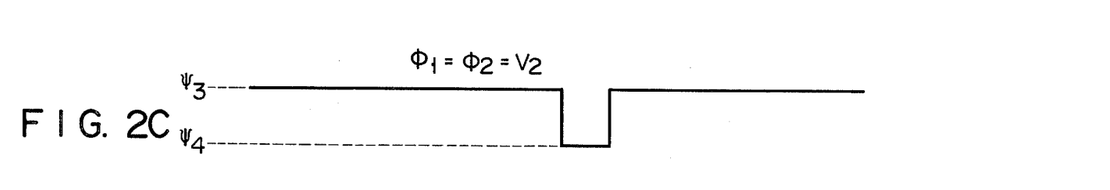

The combination of surface potential at the subregions of each region will be as shown in FIG. 2B or 2C if the voltage V$_1$ or V$_2$ is applied, respectively. The level values of the surface potentials $\Psi_1$ to $\Psi_4$ in FIGS. 2B and 2C are given correspondingly to the level values of the surface potentials $\Psi_1$ to $\Psi_4$ as shown in FIG. 1. Here, the combination of surface potentials at the subregions of the #1 as well as #3 regions stores information of binary bit "0", while the combination of surface potentials at the subregions of the #2 region stores information of binary bit "1". Thus, if each region is caused to store information according to the combination of surface potentials at the subregions, the charge transfer section 3 will be able to store fixed information of e.g. bit "0", "1", "0" as shown in FIG. 2A. This fixed information may be induced to correspond to ROM (read-only memory).

The charge transfer device as shown in FIG. 2A is driven by first and second methods. The first method is the so-called shift register drive method in which an optional input information is read out from an output section (not shown) through the charge transfer section 3. In the second method, a fixed information of e.g. bit "0", "1", "0", previously stored in the transfer section 3 by e.g. such means as described with reference to FIGS. 2A to 2C, is read out through the transfer section 3.

Figure 3A:
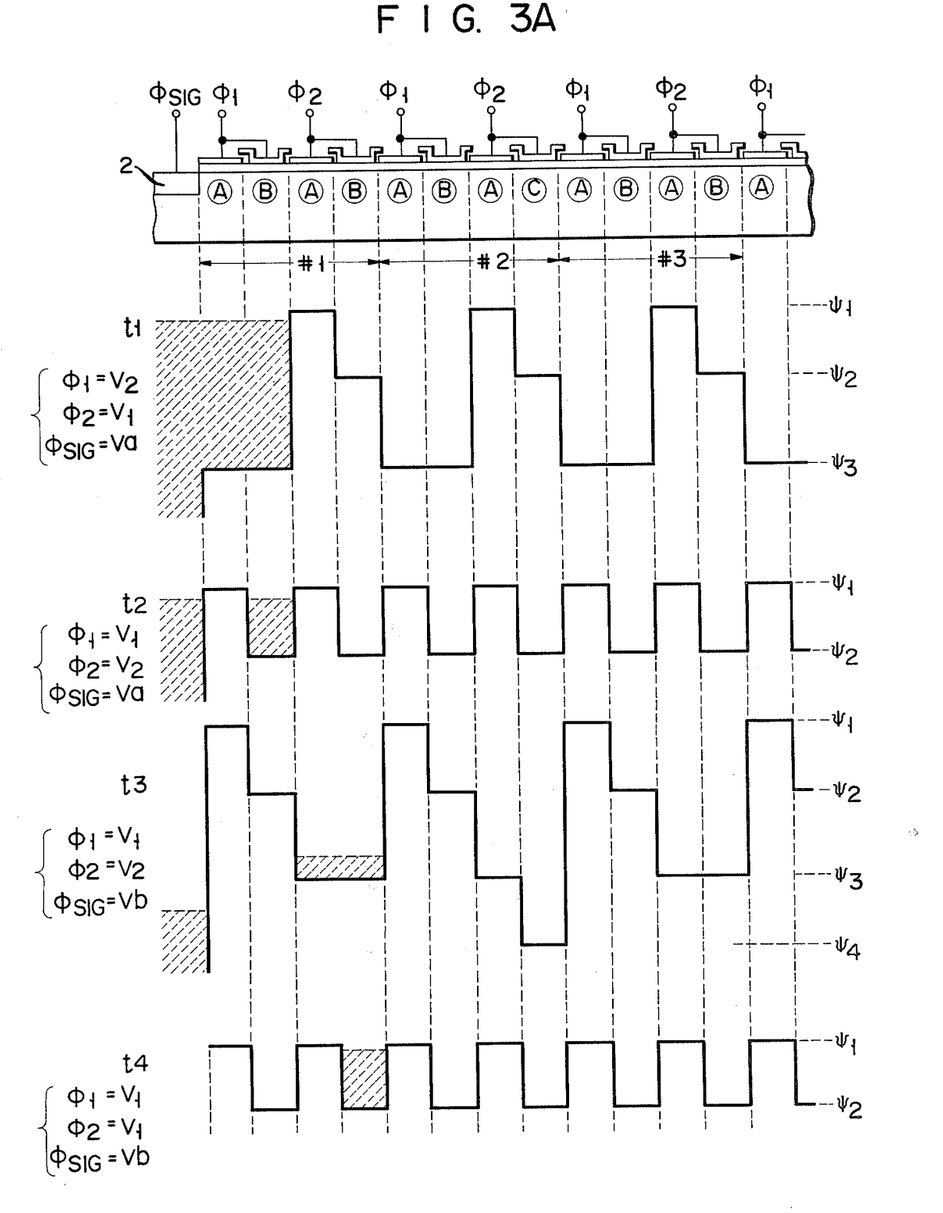
FIGS. 3A to 3C are distribution diagrams for the surface potentials of the semiconductor of the charge transfer section when the device of FIG. 2A is driven by the two-phase drop clock driving system to transfer the information inputted through the input section.
Figure 3B:
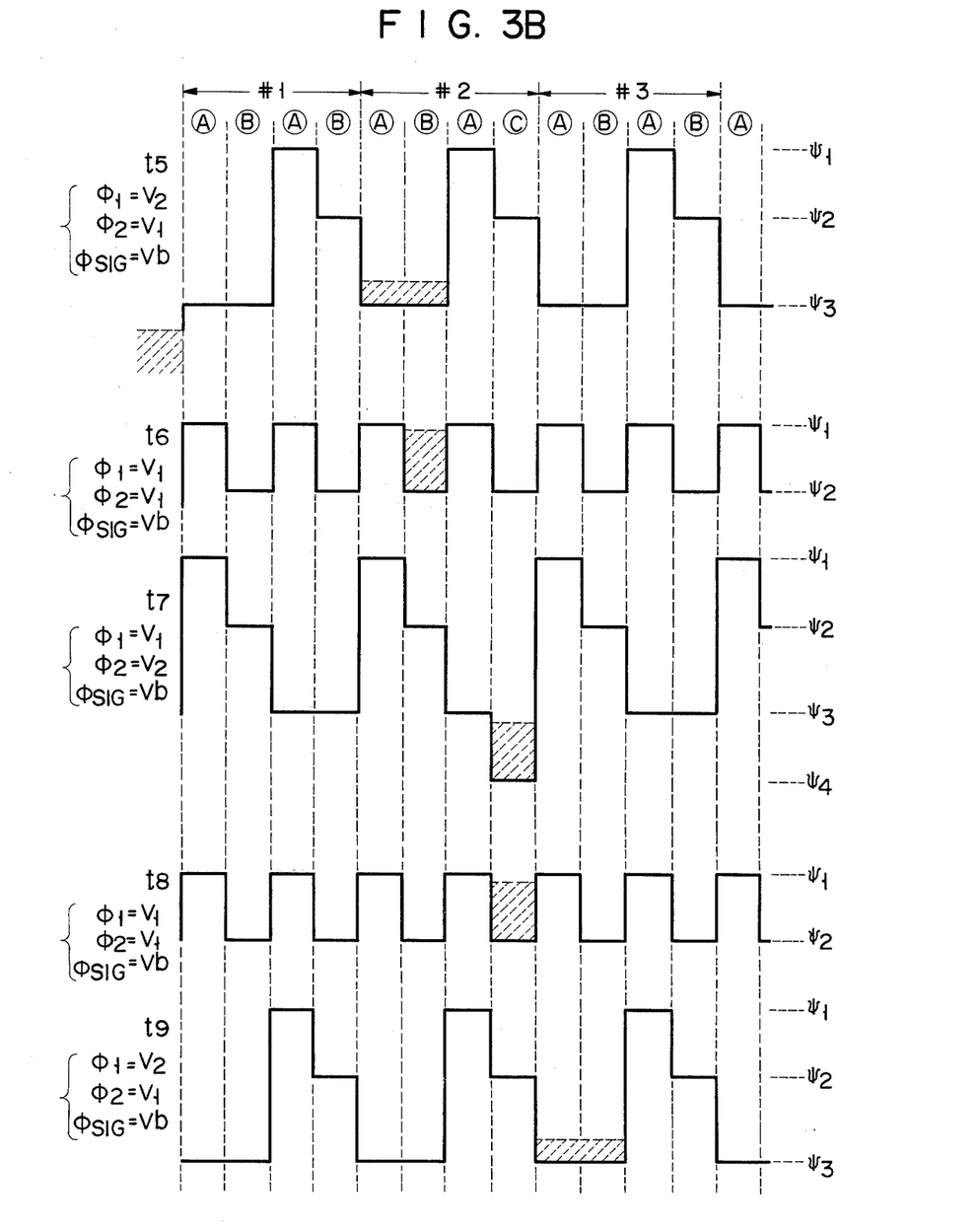
Figure 3C:
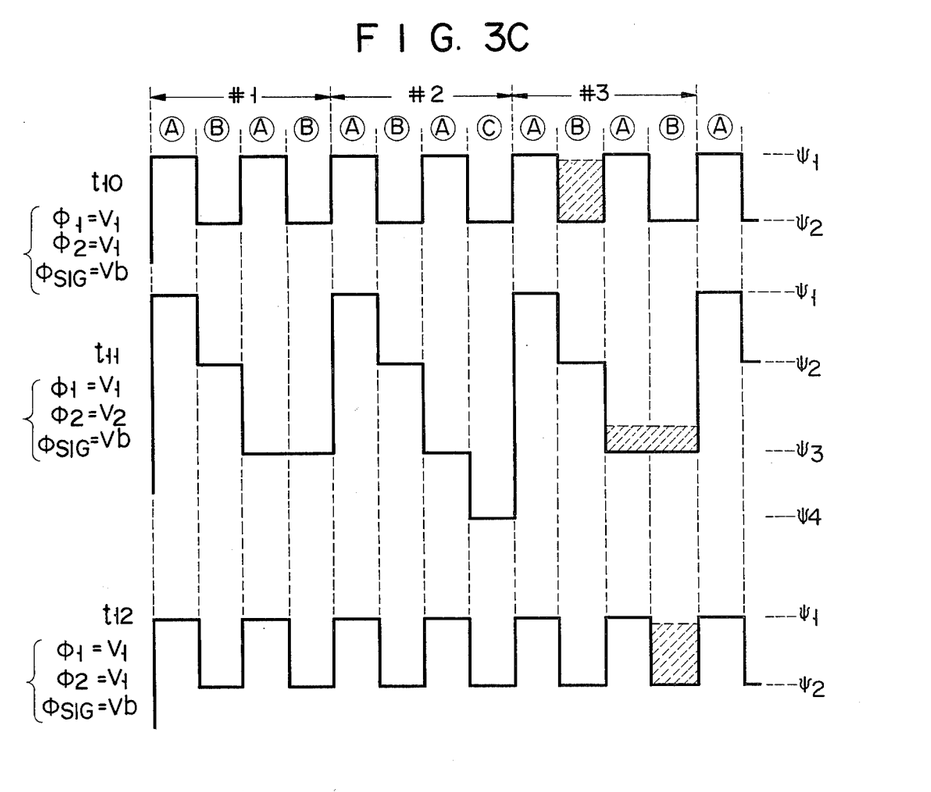
Figure 4:
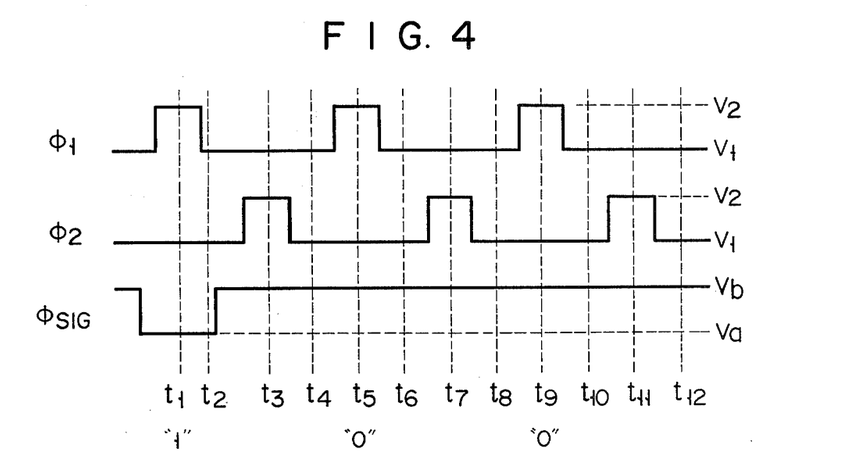
FIG. 4 shows waveforms of the clock pulses applied to the transfer electrodes and information input section when the information is transferred according to FIGS. 3A to 3C.

Now referring to FIGS. 3A to 3C and FIG. 4, there will be described an example of drive by the first method. That is, there will be described the "drop clock driving system" in which binary-level two-phase clock pulses (see FIG. 4) are employed. Since this drop clock driving system is well-known in the fields of driving technique for CCD's, it will be excluded from the detailed description herein. In FIG. 4, $\phi_1$ and $\phi_2$ are two-phase clock pulses to be applied to the transfer electrodes, and have binary levels $V_1$ and $V_2$ respectively. $\phi_{SIG}$ is a pulse to be applied to the source 2, and has levels $V_b$ and $V_a$. Here $V_a$ is an approximate value of $\Psi_1$ in compliance with an inequality $\Psi_1 < V_a < \Psi_2$, while $V_b$ is subject to an inequality $\Psi_3 < V_b$. The input information applied to the input section 2 may be determined by the voltage levels of $\phi_{SIG}$ during a period when the pulse $\phi_1$ is at the level $V_2$. In FIG. 4, a combination $\phi_1 = V_2$, $\phi_2 = V_1$, and $\phi_{SIG} = V_a$ is caused to correspond to binary "1", and a combination $\phi_1 = V_2$, $\phi_2 = V_1$, and $\phi_{SIG} = V_b$ is rendered corresponding to binary "0", then the information to be given successively to the input section 2 are "1" (time point $t_1$), "0" (time point $t_5$), and "0" (time point $t_9$). The time point $t_1$ to $t_{12}$ as shown in FIG. 4 correspond to the time points $t_1$ to $t_{12}$ as shown in FIGS. 3A to 3C. Here it should be noticed that though the surface potential formed at the subregion (C) as shown in FIG. 2A is as large as $\Psi_4$ when the voltage applied to the transfer electrodes is at $V_2$ as shown in FIG. 2C, it will be as small as $\Psi_3$ when the applied voltage is at $V_1$ as shown in FIG. 2B. Thus, as mentioned hereinbefore, the input information for the input section may be allowed to be transferred to the reading section by using the two-phase clock pulses $\phi_1$ and $\phi_2$ (FIG. 4) with usually available binary level. In FIGS. 3A to 3C, there is shown the relation between the subregions (A), (B) and (C) in the charge transfer section 3 and the surface potentials $\Psi_1$ to $\Psi_4$ at such subregions with respect to each of the time points $t_1$ to $t_{12}$. Further, the voltages corresponding to $\phi_1$, $\phi_2$ and $\phi_{SIG}$ are given for each of the time points $t_1$ to $t_{12}$. The regions shaded by broken lines are shown to be filled with electrons. FIGS. 3A to 3C clearly show the processes in which the electrons supplied to the potential wells are transferred successively according to the combination of the voltages $\phi_1$, $\phi_2$ and $\phi_{SIG}$.

Figure 5A:
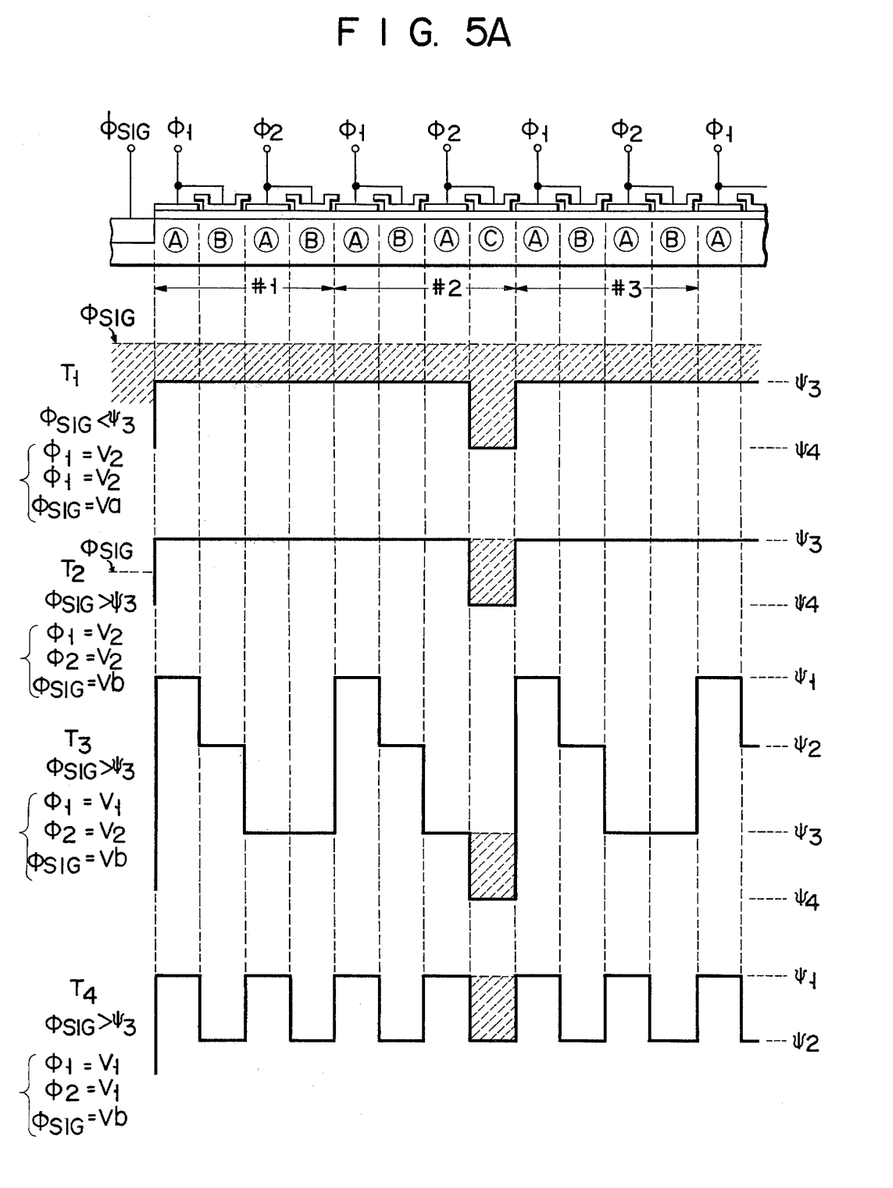
FIGS. 5A and 5B are distribution diagrams for the surface potentials of the semiconductor under the transfer electrodes when the fixed information is transferred after storage in the transfer section.
Figure 5B:
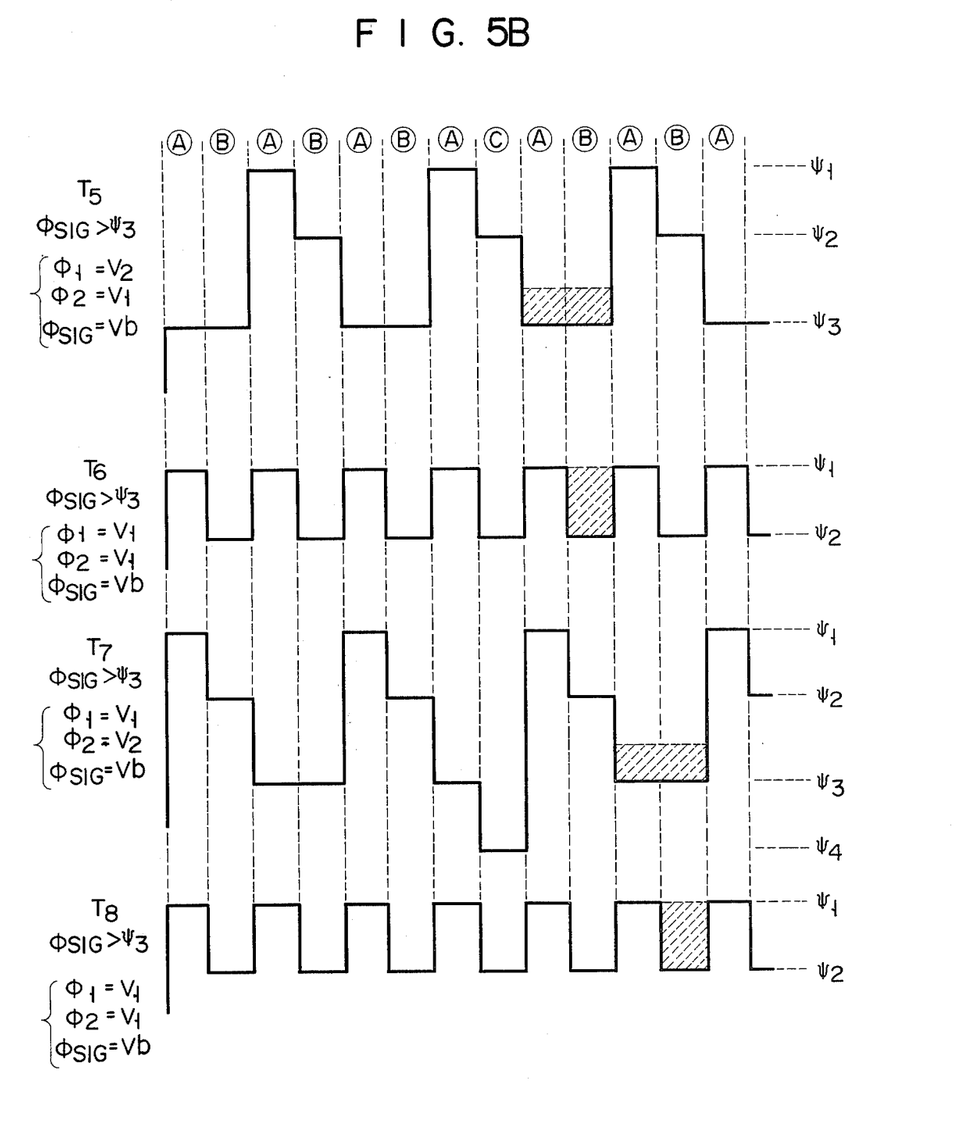
Figure 6:
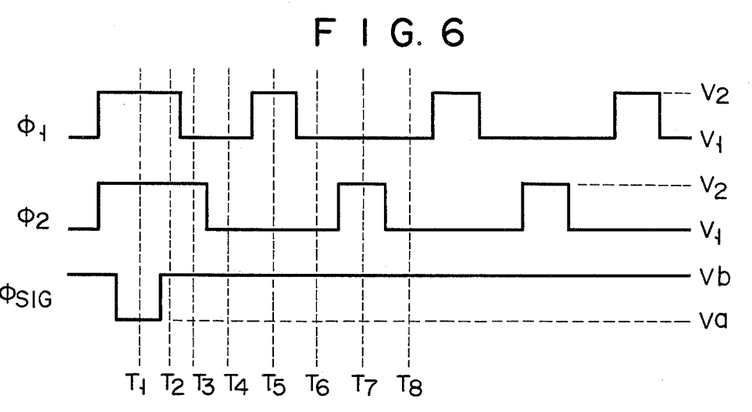
FIG. 6 shows waveforms of the clock pulses applied to the transfer electrodes and information input section in order to form the potential distribution as shown in FIGS. 5A and 5B.

Referring now to FIGS. 5A, 5B and 6, there will be described a case in which the fixed information stored in the transfer section 3 is transferred. It has already been mentioned that the fixed information is stored in the semiconductor regions #1, #2 and #3 as presence or absence of the surface potential (C). Therefore, there will be required a step (FIG. 5A-$T_1$, $T_2$, $T_3$ and $T_4$) for storing a predetermined fixed information in a prescribed semiconductor region and for injecting charges corresponding to such fixed information stored in the prescribed semiconductor region immediately after the storing and another step (FIG. 5B-$T_5$, $T_6$, $T_7$ and $T_8$) for transferring the injected charges. The moment the two-phase pulses $\phi_1$ and $\phi_2$ as shown in FIG. 6 are applied to the corresponding transfer electrodes, the pulse $\phi_{SIG}$ is applied to the source region 2. The time points $T_1$ to $T_8$ of FIG. 6 correspond to the time points $T_1$ to $T_8$ as shown in FIGS. 5A and 5B. At the time point $T_1$, $\phi_1 = \phi_2 = V_2$ and $\phi_{SIG} = V_a$, while the surface potential at the source 2 with $\phi_{SIG}$ is lower than $\Psi_3$. Consequently, the surface potentials at the semiconductor subregions (A), (B) and (C) are as shown in FIG. 5A for the time point $T_1$; the surface potential $\Psi_4$ at the subregion (C) only is at a high level. In other words, only the potential well formed at the subregion (C) is made deep enough, and the potential wells formed at the subregions are filled with charges by the source 2. At the time point $T_2$, $\phi_{SIG}$ is raised to $V_b$, so that all the charges in the potential well of the subregions but those in the potential well of the subregion (C) disappear. At the time points $T_3$ and $T_4$, the voltage of $\phi_1$ is raised to $V_1$, and that of $\phi_2$ is raised also to $V_1$ subsequently, while the voltage of $\phi_{SIG}$ is kept at $V_b$. Therefore, as shown in FIG. 5A for the time points $T_3$ and $T_4$, the potential well of the subregion (C) is filled with charges to write information "0", "1" and "0" based on the presence or absence of charge in the semiconductor regions #1, #2 and #3. These information based on the presence or absence of charge are entirely coincident with the information stored according to the combination of surface potential levels at the subregion as described above.

The fixed information, thus written in the transfer section as information based on the presence or absence of charge, is transferred through the time points $T_5$ to $T_8$ as shown in FIG. 5B. In such transfer, the pulses $\phi_1$ and $\phi_2$ may be applied to the transfer electrodes while keeping the level of the voltage $\phi_{SIG}$ at $V_b$, that is, while retaining the surface potential of the source 2 higher than the surface potential $\Psi_3$. The transfer setp for the charges supplied to the subregion (C) is shown in FIG. 5B for the time points $T_5$ to $T_8$. Thus, transferred fixed information may be read out by detecting at the reading section, the charges supplied to the initial subregion (C). FIGS. 5A and 5B also illustrate the case in which the two-phase drop clock driving system is employed.

Although there has been described the transfer of information by means of the two-phase driving pulses, it is to be understood that three- or four-phase or higher driving pulses may also be used without departing from the scope or spirit of the invention. When using the three-phase driving pulse, however, the number of electrodes included in each region may be three, while, when using the four-phase driving pulse, the number of electrodes may be the same as that with the two-phase driving pulse.

Figure 7A:
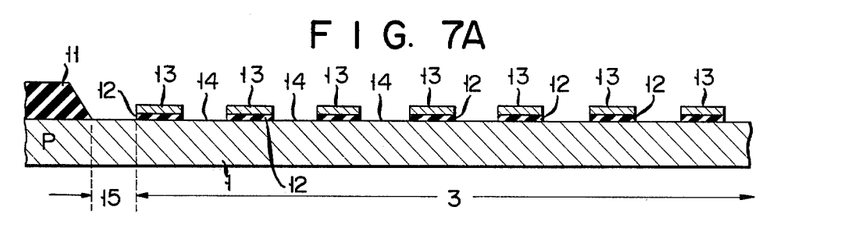
FIG. 7 is a sectional view showing the manufacturing processes for the device of FIG. 2A.

Referring now to FIGS. 7A to 7D, there will be described an example of manufacturing process for the device as shown in FIG. 2A. In FIG. 7A, the silicon dioxide film 11 is formed all over the top surface of the p-type silicon semiconductor substrate 1 to a thickness of e.g. 1 micron. Thereafter, the $SiO_2$ film 11 on a section 15 to form the source 2 as well as on the charge transfer section 3 is etched and removed. At the region cleared of such SiO$_2$ film 11 is formed another SiO$_2$ film 12 with a thickness of e.g. 1,000Å, and a polycrystalline Si film 13 is further formed on the SiO$_2$ film 12. Subsequently, the polycrystalline Si film 13 over a region 14 to form a storage region gate and a region 15 to form the source 2 is etched selectively. The SiO$_2$ film 12 is etched with the unetched Si film 13 as a mask. The section of the semiconductor substrate 1 after passing through the above processes is shown in FIG. 7A.

Subsequently, an SiO$_2$ film 16 is formed on the exposed surface of the substrate 1 and the remaining polycrystalline Si film 13 to a thickness of e.g. 1,000Å by the heat oxidation method. Then, by using a suitable mask, e.g. $1 \times 10^{14}$ cm$^{-2}$ of boron and $2 \times 10^{13}$ cm$^{-2}$ of phosphorus are injected into the surface of the subregion (B), and $5 \times 10^{11}$ cm$^{-2}$ of phosphorus is injected into the surface of the subregion (C) by the ion-injection method. Thus, formed high-concentration surface layers of the subregions (B) and (C) are denoted by numerals 17 and 18 (FIG. 7B) respectively.

Figure 7B:
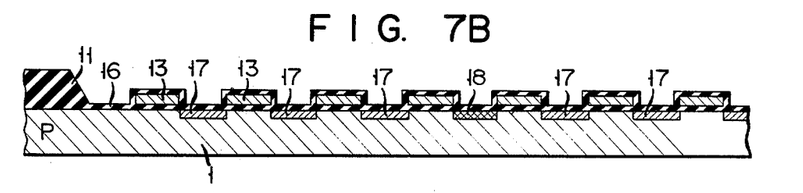
Figure 7C:
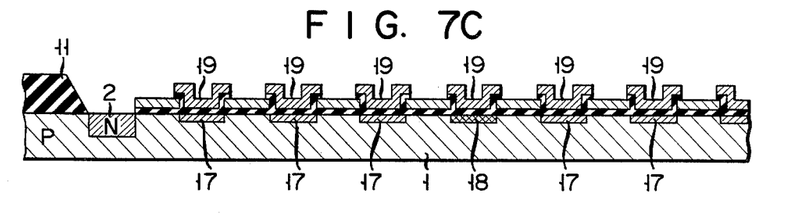

Thereafter, a polycrystalline Si film 19 is formed on the SiO$_2$ film 16 (FIG. 7B). This film 19 is selectively etched to form gate electrodes at the storage region 14. Then, an n-type impurity is diffused to form the source 2 after removing the SiO$_2$ film 16 at the source region 15 with the gate electrode 19 used as a mask (FIG. 7C).

Figure 7D:
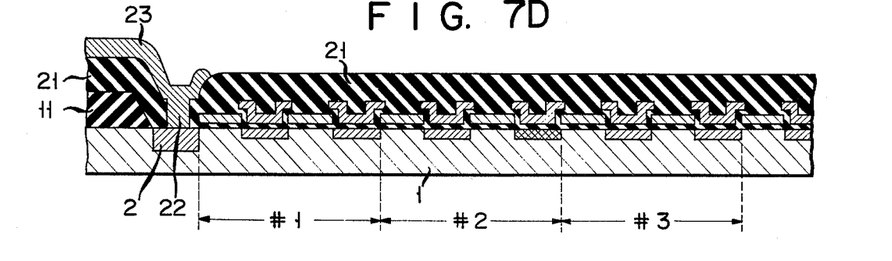

Subsequently, a low-temperature oxidized film (SiO$_2$) 21 (with a thickness of e.g. 1 micron) is formed all over the surface, and then a contact hole 22 is bored above the source 2. Then aluminum is evaporated all over the surface, and a resultant aluminum film is selectively etched to form a source lead 23. Since the transfer electrodes are drawn out connectedly with the transfer electrodes of a device disposed in parallel with the device as shown in FIG. 7D, the outgoing lead for such transfer electrodes are not shown in the drawing.

In the device as shown in FIG. 2A to 7D, the prescribed combination of surface potential levels at the subregions in each semiconductor region is obtained by changing the concentrations of the surface layers of the prescribed semiconductor subregions. Instead of changing such concentrations, however, the thickness of the insulation layer between the subregion and the transfer electrode may be changed. Further, the combination of the subregions and surface potentials may be specified according to the combination of changes in concentration and insulating layer thickness.

What we claim is:
1. A charge transfer device, comprising:
a charge supplying source section;
a charge transfer section coupled at one end to said charge supplying source section and including a semiconductor substrate of a first conductivity type, an insulation layer provided on said semiconductor substrate and a plurality of charge transfer electrodes provided on said insulation layer, each adapted to be supplied with a gate signal;
an output section coupled to the other end of said charge transfer section;
said charge transfer section including a plurality of first semiconductor regions in which first fixed information is stored, and a plurality of second semiconductor regions in which second fixed information is stored, each of said first and second semiconductor regions being serially disposed upon said semiconductor substrate between said source section and said output section;
each of said first semiconductor regions including a first pair of subregions and a second pair of subregions disposed adjacent to said first pair of subregions, each of said first and second pairs of subregions including a first type subregion and a second type subregion disposed adjacent to said first type subregion with each said subregion having a discrete charge transfer electrode disposed thereover;
each of said second semiconductor regions including a third pair of subregions and a fourth pair of subregions disposed adjacent to said third pair of subregions, each of said third pair of subregions including a first type subregion and a second type subregion disposed adjacent to said first type subregion, each of said fourth pair of subregions including a first type subregion and a third type subregion disposed adjacent to said first type subregion, each of said first, second, and third type subregions having a discrete charge transfer electrode disposed thereover;
each of said discrete charge transfer electrodes disposed over said first and third pairs of subregions adapted to be supplied with a first gating signal voltage, and each of said discrete charge transfer electrodes disposed over said second and fourth pairs of subregions adapted to be supplied with a second gating signal voltage;
each of said subregions exhibiting a gate voltage-surface potential characteristic curve such that the characteristic curves for said first type subregion and for said third type subregion are approximately parallel and the characteristic curve of said second type subregion is such that it intersects with the characteristic curves of said first and said third type subregions.

2. The charge transfer device as set forth in claim 1, wherein:
said first type subregion includes a semiconductor surface layer which is identical to said semiconductor substrate of the first conductivity type;
said second type subregion includes a semiconductor surface layer which is doped with an impurity of a first conductivity type and an impurity of a second conductivity type so as to impart a higher impurity concentration to said subregion than that of said semiconductor substrate; and
said third type subregion includes a semiconductor surface layer which is doped with an impurity of a second conductivity type so as to impart a higher impurity concentration to said subregion than that of said semiconductor substrate.

3. The charge transfer device as set forth in claim 1, wherein:
said semiconductor substrate is of p-type;
said first type subregion includes a semiconductor surface layer which is formed by doping said P-type semiconductor substrate with N-type phosphorus and P-type boron impurities; and
said third type subregion includes a semiconductor surface layer which is formed by doping said P-type semiconductor substrate with N-type phosphorus impurities.

4. The charge transfer device as set forth in claim 1, wherein:
the subregions of said first semiconductor region are serially arranged along said semiconductor substrate in the direction of said source section toward said output section as follows: first type subregion, second type subregion, first type subregion, second type subregion; and the subregions of said second semiconductor region are serially arranged along said semiconductor substrate in the direction of said source section toward said output section as follows: first type subregion, second type subregion, first type subregion, third type subregion.

5. The charge device as set forth in claim 1, wherein: said insulation layer is of non-uniform thickness such that the insulation layer covering some semiconductor subregions is of different thickness from that covering other subregions.

* * * * *